(12) United States Patent
Hsu et al.

(10) Patent No.: US 7,378,895 B2
(45) Date of Patent: May 27, 2008

(54) ON-CHIP ELECTRICALLY ALTERABLE RESISTOR

(75) Inventors: Louis C. Hsu, Fishkill, NY (US);
Brian L. Ji, East Fishkill, NY (US);
Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/996,312

(22) Filed: Nov. 23, 2004

(65) Prior Publication Data
US 2006/0109042 A1    May 25, 2006

(51) Int. Cl.
*H03L 5/00* (2006.01)
(52) U.S. Cl. .................. 327/308; 333/81 R; 327/234
(58) Field of Classification Search ............... 327/306, 327/308, 276, 78, 231–234; 333/81 R
See application file for complete search history.

(56) References Cited

U.S. PATENT DOCUMENTS

| | | | | |
|---|---|---|---|---|
| 5,296,835 A | * | 3/1994 | Nakamura | 338/130 |
| 5,650,739 A | * | 7/1997 | Hui et al. | 327/262 |
| 5,790,331 A | * | 8/1998 | Aranovsky | 360/46 |
| 6,404,274 B1 | * | 6/2002 | Hosono et al. | 327/538 |
| 6,853,585 B2 | * | 2/2005 | Lee et al. | 365/185.22 |

\* cited by examiner

*Primary Examiner*—Dinh T. Le
(74) *Attorney, Agent, or Firm*—Law Office of Charles W. Peterson, Jr.; Wan Yee Cheung, Esq.; Ido Tuchman, Esq.

(57) ABSTRACT

A programmable, electrically alterable (EA) resistor, an integrated circuit (IC) chip including the EA resistor and integrated analog circuits using on-chip EA resistors. Phase change storage media form resistors (EA resistors) on an IC that may be formed in an array of parallel EA resistors to set variable circuit bias conditions for circuits on the IC and in particular, bias on-chip analog circuits. The bias resistance is changed by changing EA resistor phase. Parallel connection of the parallel EA resistors may be dynamically alterable, switching one or more parallel resistors in and out digitally.

11 Claims, 5 Drawing Sheets

ON-CHIP ELECTRICALLY ALTERABLE RESISTOR

CROSS REFERENCE TO RELATED APPLICATION

The present invention is related to U.S. application Ser. No. 10/732,579 entitled "INTEGRATED CIRCUIT WITH UPSTANDING STYLUS" and to U.S. application Ser. No. 10/732,580 entitled "PHASE CHANGE TIP STORAGE CELL" both to David V. Horak et al., filed Dec. 10, 2003 and assigned to the assignee of the present invention.

FIELD OF THE INVENTION

The present invention is related to integrated circuits (IC) with on-chip resistors and particularly to ICs with on-chip adjustable resistance.

BACKGROUND DESCRIPTION

While highly dense digital circuits (e.g., VLSI memories and microprocessors with hundreds of millions of devices on a single chip) are commonplace, designers have been much less successful condensing analog circuits into smaller and smaller areas. One reason this has been difficult is that analog circuits typically require a number of passive elements that are not easily shrunk. Resistors are necessary, for example, to bias operational amplifiers (op-amps) and play an important role in analog circuits. A typical analog to digital (A/D) converter or digital to analog (D/A) converter may use what is known as a resistor ladder to generate reference voltages for a group of parallel op-amps converting from one domain to the other.

A typical resistor may be formed in an integrated circuit (IC) from a (relatively) long run of a narrow strip of non-metal conductive material, e.g., polysilicon or doped silicon junction. Unfortunately, these long runs also have a relatively high capacitance per unit length, thus acting as a distributed RC with the R and C being the resistance and capacitance per unit length, respectively. Consequently, application of a voltage at one end may not be exhibited at the other until some time later because of the inherent delay in the distributed RC. Also, the larger the resistor, the longer the run and the more likely the capacitance is affected by other on chip activity, e.g., wiring on an adjacent layer, wiring that runs parallel but on the same layer, and etc. Moreover, these sources of additional capacitance are also noise sources that can disturb a sensitive measurement at the worst possible time, but are impossible to identify and isolate.

While relatively small (area) resistors with low resistance may be made without suffering from appreciable variation from resistor to resistor, shrinking larger resistor runs needed for higher resistance does not provide such typically consistent results. The long, narrow, thin lines used for these higher-resistance resistors are much more sensitive to line width variations because, to minimize resistor size, they are made at minimum line widths to maximize resistance per unit length. Since process variations may cause minimum width lines to vary as much as 2×, this can cause the resistance to vary as much as 2× also.

Although occasionally, fused lines have been used to trim resistance to desired values, generally, designers have found off chip resistor packs a simpler solution. Unfortunately, both of these approaches expand chip size. Fuses need a window through upper chip layers and clearance to adjacent features to avoid damaging other circuits; off chip resistors require wiring, pads and etc. to connect to on-chip circuits. Consequently, resistors are seldom integrated with analog circuits and analog circuits are seldom integrated with digital circuits. So, unfortunately, analog chips are typically larger than much denser digital chips.

Thus, there is a need to reduce resistor size for on-chip resistors and to provide a broad range of resistances for such on-chip resistors.

SUMMARY OF THE INVENTION

It is a purpose of the invention to reduce on-chip resistor size on integrated circuit (IC) chips;

It is another purpose of the invention to reduce integrated analog circuit size;

It is yet another purpose of the invention to include adjustable and programmable resistance on densely integrated analog circuits.

The present invention relates to a programmable, electrically alterable (EA) resistor, an integrated circuit (IC) chip including the EA resistor and integrated analog circuits using on-chip EA resistors. Phase change storage media form resistors (EA resistors) on an IC that may be formed in an array of parallel EA resistors to set variable circuit bias conditions for circuits on the IC and in particular, bias on-chip analog circuits. The bias resistance is changed by changing EA resistor phase. Parallel connection of the parallel EA resistors may be dynamically alterable, switching one or more parallel resistors in and out digitally.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
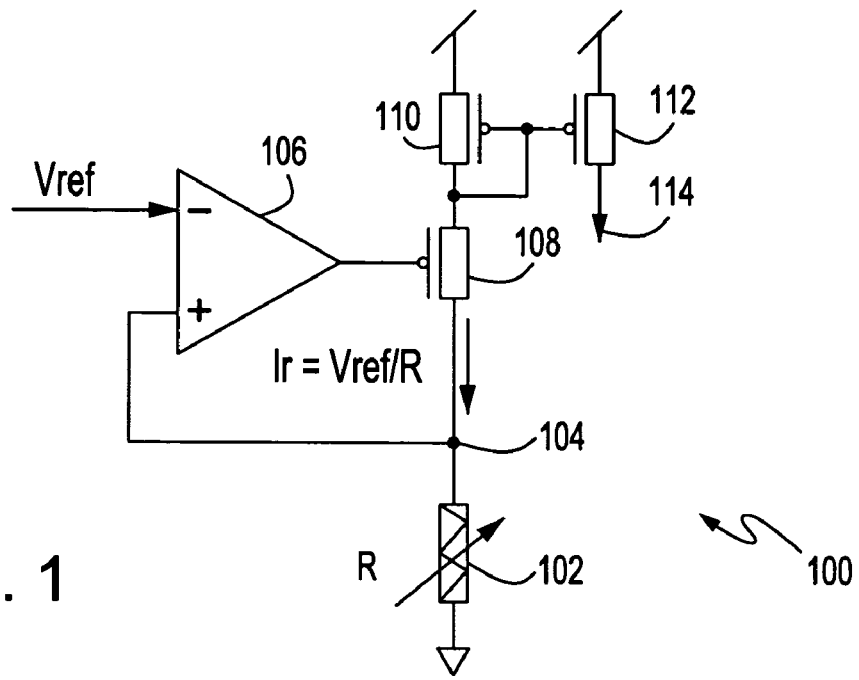
FIG. 1 shows an example of an analog circuit that includes an electrically alterable (EA) resistor on the same integrated circuit (IC) chip according to a preferred embodiment of the present invention.

Turning now to the drawings and more particularly FIG. 1 shows an example of an analog circuit 100 that includes an electrically alterable (EA) resistor 102 e.g., on the same integrated circuit (IC) chip, according to a preferred embodiment of the present invention. Preferably, the IC is in a standard insulated gate field effect transistor (FET) technology and more particularly, in the complementary FET technology that is commonly referred to as CMOS. In this example, the circuit 100 is an adjustable current source and the EA resistor 102 is a phase change material resistor connected between ground and a resistive load line 104. An operational amplifier (op-amp) 106 compares a voltage 104 drop across the EA resistor 102 against a reference voltage ($V_{ref}$). The op-amp 106 drives the gate of a transistor 108, a p-type FET (PFET) in this example. The PFET 108 is series connected with the EA resistor 102, providing feedback to the op-amp 106 to match $V_{ref}$. The PFET 108 is also series connected with one side of a current mirror, formed by PFETs 110, 112. The adjustable current output 114 is the drain of the other PFET 112.

Essentially, current ($I_R$) through the EA resistor 102 is such that resistive load line 104 voltage across the EA resistor 102 matches $V_{ref}$. So, $V_{ref}=I_R*R$. The current mirror device 112 provides a matched/scaled current ($I_{out}$) at adjustable current output 114. So, for example, with $V_{ref}=0.6V$ and $R=1.2K\Omega$, $I_R=500$ µA. $I_{out}$ is scaled from $I_R$ directly proportionately to the width ($W_{112}$) of PFET 112 to the width ($W_{110}$) of PFET 110, i.e., $I_{out}/I_R=W_{112}/W_{110}$. Selecting $W_{112}=W_{110}/5$, for example, yields $I_{out}=100$ µA. Since $V_{ref}$ and the dimensions of PFET 110 are typically fixed by design, adjusting the resistance of the EA resistor 102 adjusts $I_R$ and, correspondingly $I_{out}$.

Preferably, the EA resistor 102 is a solid state phase change material resistor of a chalcogen based material. Chalcogens include the Group VI elements such as sulfur (S), selenium (Se) and tellurium (Te). Well known chalcogen based materials, commonly known as chalcogenides, are a chalcogen alloyed with at least one of germanium (Ge), arsenic (As), silicon (Si), and antimony (Sb) and exist in at least two different classifiable solid states or phases. Most preferably, the EA resistor 102 is a $Ge_2Sb_2Te_5$ resistor. The most extreme two states can be classified simply as amorphous and crystalline states with other less easily discernable states ranging between those two extreme states. In particular, when heat is applied to some phase change chalcogenides, the material switches phases from one (e.g., amorphous phase or reset) state to a second (e.g., crystalline phase or set) state. The amorphous state has a disordered atomic structure and the crystalline state generally is polycrystalline. Each phase has very different electrical properties. In its amorphous state, the material behaves as an insulator below some turn on threshold voltage ($V_t$), i.e., acts as a stepped high resistance or an open circuit; in its crystalline state, the same material behaves resistively as a much lower resistance.

Figure 2A:
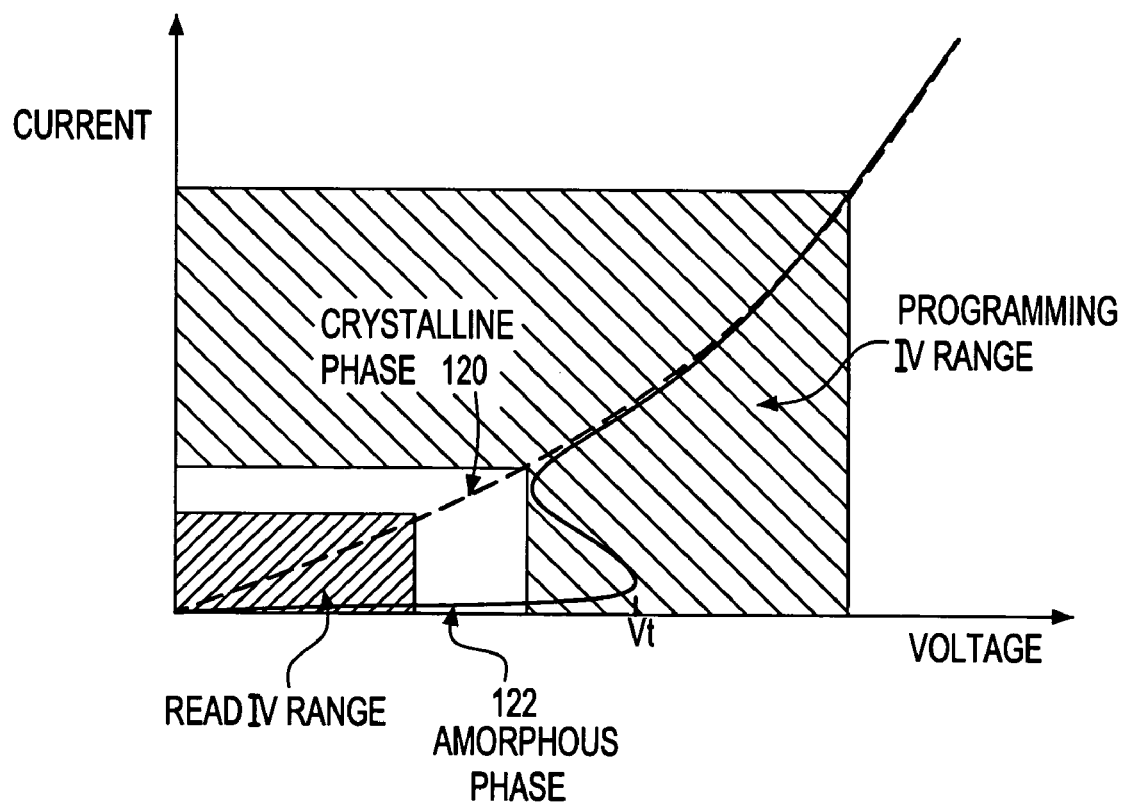
FIGS. 2A-C show examples of a current verses voltage (I-V) characteristic and phase resistance for a suitable chalcogenide material.
Figure 2B:
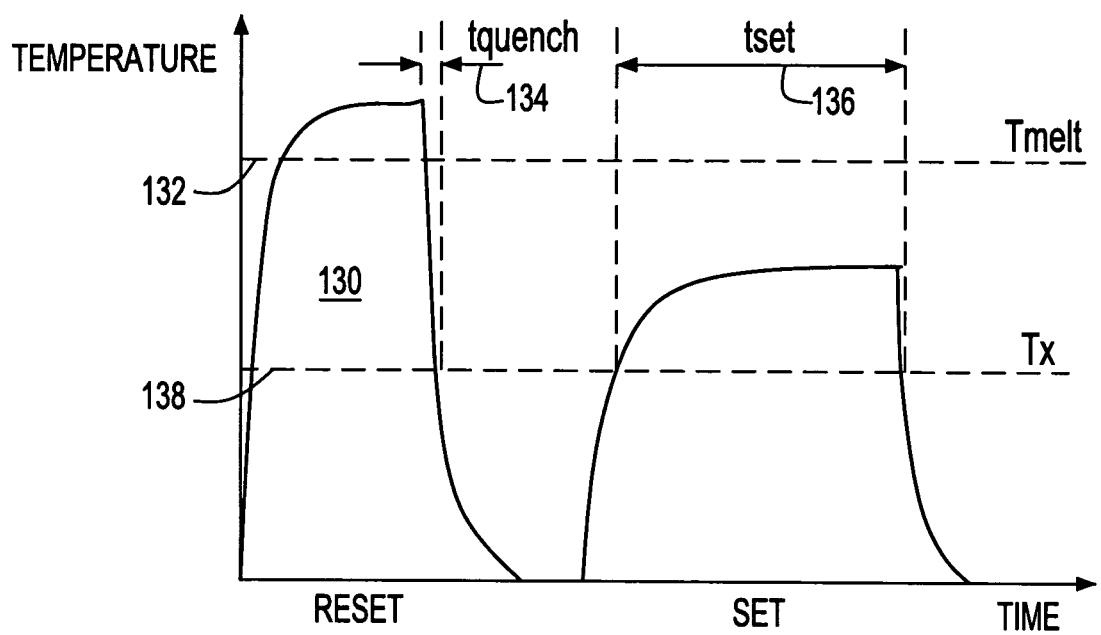
Figure 2C:
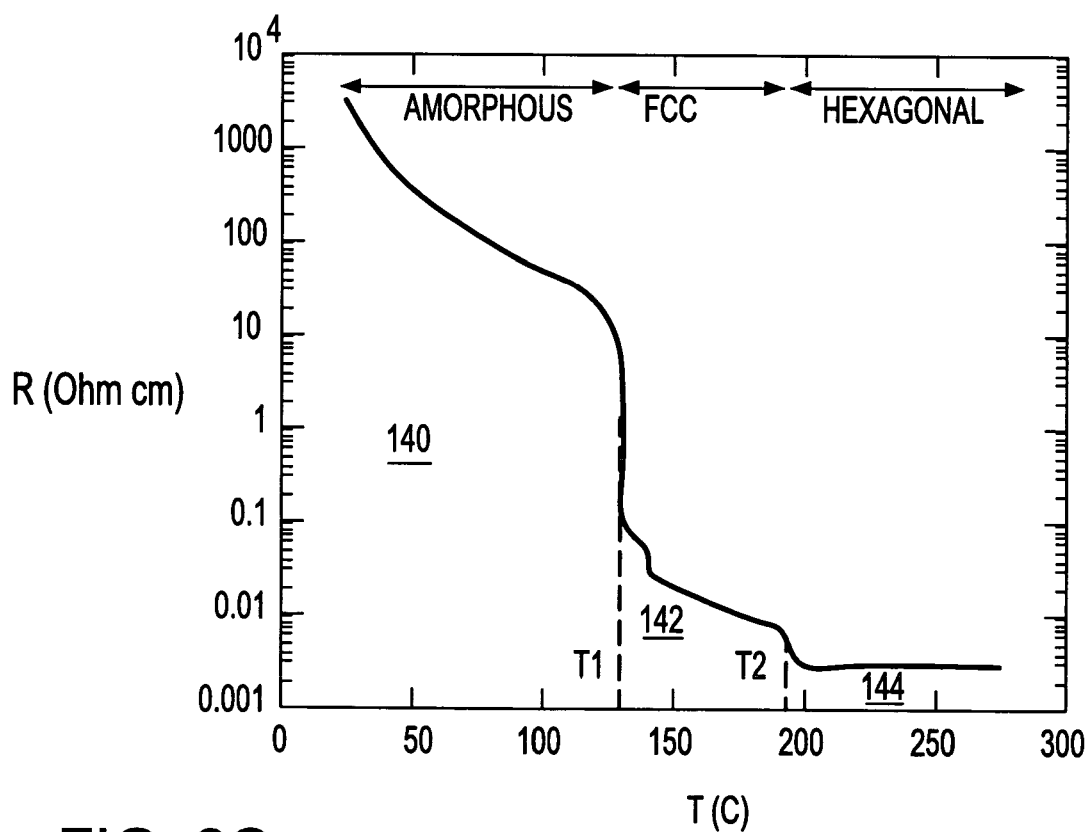

FIGS. 2A-C show examples of a current verses voltage (I-V) characteristic and phase resistance for a suitable chalcogenide material. As shown in the two extremes of FIGS. 2A-B, the material is resistive in its crystalline phase 120 and a nonlinear or stepped resistance in its amorphous phase 122 with substantially reduced current below $V_t$. So, crystalline phase change material conducts current resistively and amorphous phase change material, more or less, has a high resistance region at low voltages, i.e., below $V_t$, which typically occurs at or below 1V for a thin (<25 nm) chalcogenide layer.

FIG. 2B shows an example of typical evolution profiles for temperature programming of preferred embodiment EA resistors. Heating the programmable material switches material states or phases: switching to its amorphous (RESET) phase in 130 by heating to ($T_{melt}$) 132 and allowing it sufficient time to cool ($t_{quench}$) 134; and, alternately, crystallizing (SET) in 136 by heating it to ($T_x$) 138 for sufficient time ($t_{set}$) and allowing it to cool. Thus, by switching the phase change material between crystalline and amorphous phase and back, the resistor switches from a low resistance state to a much higher resistance state and back to its low resistance state.

The transition between these states is selectively reversible with heat, i.e., the phase change material may be set/reset. Thus, the resistance for the phase change material may be switched between high and much lower resistance states. As with anything that has two or more discernable and selectable states, one of the 2 stable states can be designated as a logic one and the other a logic zero. Thus, phase change material, which has found use as the reflective layer in rewritable compact disks (CD) and digital versatile disks (DVD) and in solid state storage devices, has also been used for non-volatile storage, e.g., as a memory cell storage media in a semiconductor chip. Further, multiple bit memory elements have been made using the intermediate states inherent in the variation in resistivity between amorphous and crystalline. The resistivity of these materials varies in between amorphous and crystalline states by 1000 times and as much as 6 orders of magnitude.

FIG. 2C shows a three-phase example comparing typical resistance ranges with crystallization transition temperatures for a typical chalcogenide storage element. For this three-phase example, in addition to the amorphous state or phase in region 140 where the chalcogenide storage element behaves somewhat like a insulator below $V_t$, the phase change storage material can be programmed for 2 identifiable crystalline states 142, 144. Transition to the first of the two crystalline states 142 occurs at the amorphous to Face Center Cubic (FCC) crystallization transition temperature ($T_1 \cong 130°$ C.) and to the second 144 occurs at the FCC to Hexagonal (Hex) transition temperature ($T2 \cong 185°$ C.). So in this example, the dynamic range of the resistivity of the chalcogenide element ranges from about 1 mΩ-cm in the Hex state 144 to at least 20 Ω-cm and as high as 1KΩ-cm or more in amorphous state 140, i.e., more than six orders of magnitude.

Thus, providing an array of such switched chalcogenide storage elements or a switched array of crystalline chalcogenide storage elements provides an EA resistor with a large, selectable, nonvolatile resistivity-range. For a simple example, a number (n) of parallel identical switched-chalcogenide storage-element resistors have an equivalent crystalline resistance of $R_{eq}=R_l/n$, where $R_l$ is the low resistance for each. Switching a single element to its amorphous phase incrementally increases the equivalent resistance, i.e., because 3-6 orders of magnitude may essentially be treated as an open circuit, $R_{eq} \cong R_l/(n-1)$. Similarly, with all but one element switched to the amorphous state, $R_{eq} \cong R_l$. Thus, such an EA resistor has a resistance range from $R_l/n$ to $R_l$ and, effectively, to an open circuit. For an example of forming arrays of crystalline chalcogenide storage elements, see U.S. application Ser. No. 10/732,579 entitled "INTEGRATED CIRCUIT WITH UPSTANDING STYLUS" and U.S. application Ser. No. 10/732,580 entitled "PHASE CHANGE TIP STORAGE CELL" both to David V. Horak et al., filed Dec. 10, 2003, assigned to the assignee of the present invention and incorporated herein by reference.

Figure 3A:
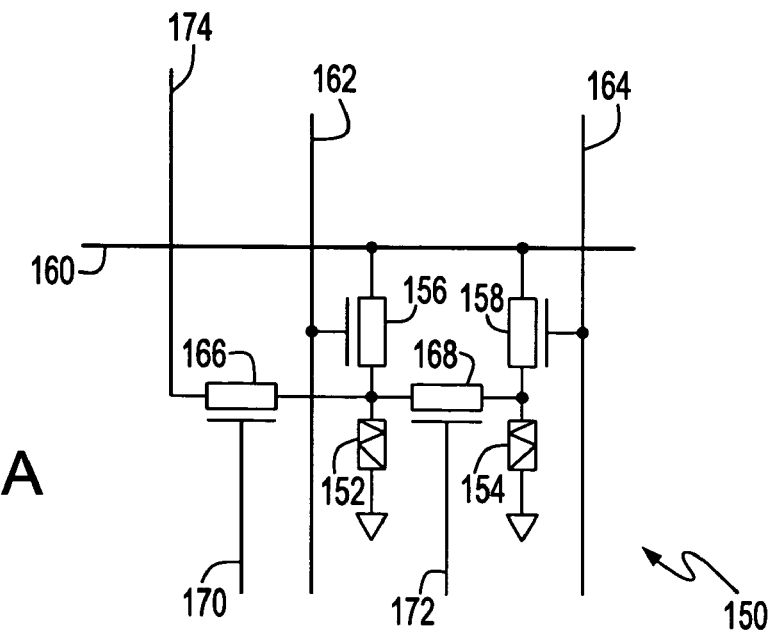
FIGS. 3A-C show examples of arrays of EA resistors that may be used in combination with each other for a dynamically programmed adjustable resistor.
Figure 3B:
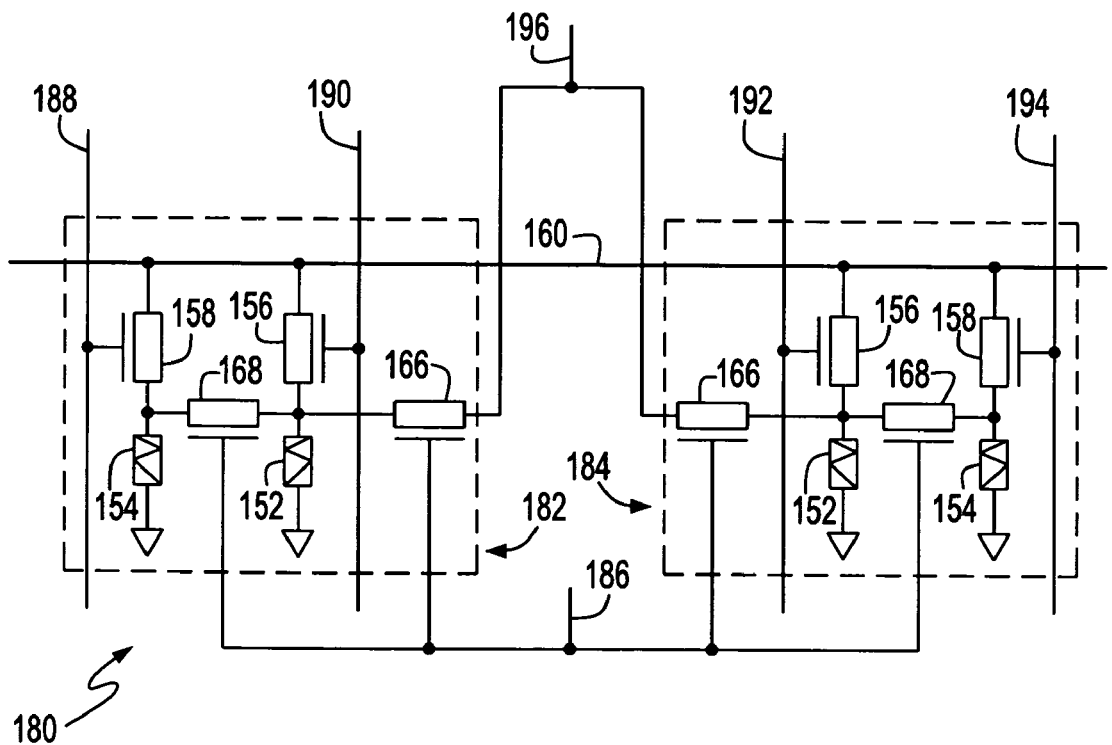
Figure 3C:
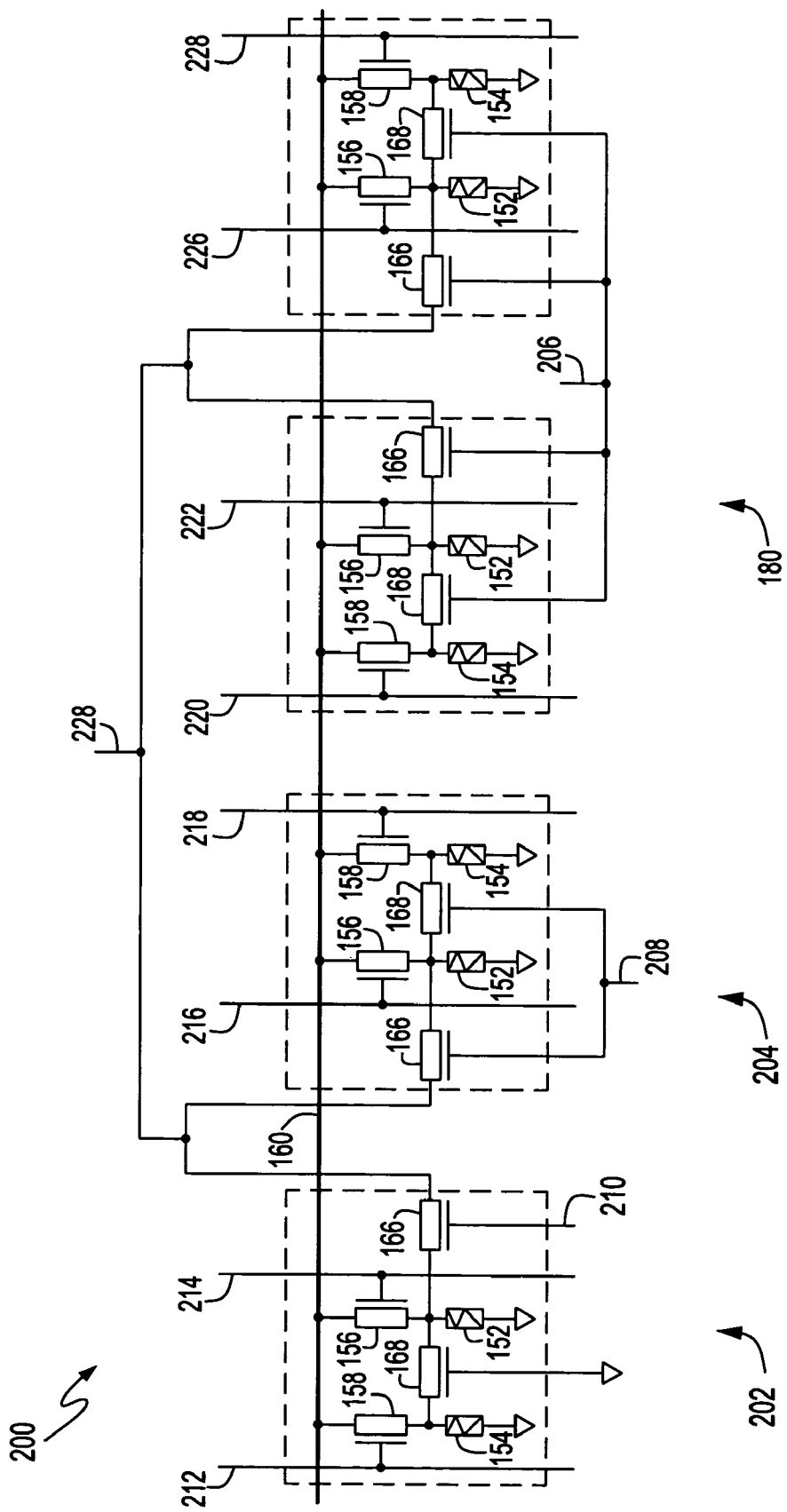

FIGS. 3A-C show examples of arrays of EA resistors that may be used alone or, in combination with each other for a dynamically programmed adjustable resistor according to a preferred embodiment of the present invention. FIG. 3A shows an example of a simple dual-cell switched resistance unit 150 that may be used as a single EA resistor 152 or a pair of selectively parallel EA resistors 152, 154. A program select NFET 156, 158 connect the pair of parallel EA resistors 152, 154 to a program supply line 160. Program select lines 162, 164 gate corresponding program select NFETs 156, 158, respectively. Optionally, the program supply line 160 and program select lines 162, 164 may each be connected to shared lines in an array of dual-cell switched resistance units 150. A read access NFET 166 selectively couples the resistance from one or both of the pair of the selectively parallel EA resistors 152, 154. A coupling NFET 168 selectively couples the EA resistors 152, 154 in parallel. Typically, the read access NFET 166 and the coupling NFET 168 are much smaller and, in particular, much narrower than the program select NFETs 156, 158. The gates 170, 172 of read access NFET 166 and coupling NFET 168 may be tied on/off or gated by select signals for dynamic programming. With the read access NFET 166 and, optionally, the coupling NFET 168 on; the dynamically programmed adjustable resistance is presented at the other end 174 of the read access NFET 166, e.g., at the resistive load line 104 in FIG. 1. In particular, dual-cell switched resistance units 150 may be treated as a step and repeat unit to form a programmable resistor array. Thereafter, individual resistors in each dual-cell switched resistance unit 150 can be switched independently or jointly.

Each EA resistor 152, 154 may be programmed by placing a programming voltage on the program supply line 160 and thus, raising and holding high either or both of the program select lines 162, 164 long enough for the selected EA resistor(s) 152, 154 to switch phases. With one or both of the select lines 162, 164 high, current through the respective EA resistor 152, 154 is sufficient that the power dissipated by the EA resistor 152, 154 raises the resistor temperature sufficiently (i.e., to $T_x$ to set or to $T_{melt}$ or reset it) and allowing sufficient time to cool, $t_{quench}$ or $t_{set}$, respectively. Thereafter, the respective program select lines 162, 164 are returned low and clamped to ground. Having adjusted or switched the resistance in the EA resistors 152, 154, a single EA resistor 152 may be selected, simply by raising the gate 170 of read access NFET 166; and, the combined value of both may be read by also raising the gate 172 of the coupling NFET 168. Optionally, if only a single EA resistor 152 is required, the gate 172 of the coupling NFET 168 may be tied to ground.

FIG. 3B shows an example of an adjustable resistor 180 where two pairs of dual-cell switched resistance units 182, 184 are combined for use as a single four way adjustable resistor. A single selectable program-supply line 160 is shared by both resistor units 182, 184. Similarly, a common resistor select line 186 is connected to the gates of both access NFETs and coupling NFETs. Program select lines 188, 190, 192, 194 are selectable to program each resistor in switched resistance units 182, 184, substantially as described for switched resistance unit 150 of FIG. 3A. Similarly, when the common resistor select line 186 is raised, the parallel resistance exhibited by the four programmed resistors is at the resistive load line output 196. Thus, zero to four individual resistors may be programmed individually or together.

FIG. 3C shows an example of a dynamically selectable programmable resistor 200 including a single four way adjustable resistor 180 and two dual-cell switched resistance units 202, 204, wherein one 202 is connected as a single resistor and the other 204 is connected as a pair of selectively parallel resistors. Again, the resistor units 180, 202, 204 share a single selectable program-supply line 160. However, in this example, a resistor select line 206 is connected to the gates of both access NFETs and coupling NFETs in the four way adjustable resistor 180; a second resistor select line 208 is connected to the gates of both the access NFET and the coupling NFET in the pair of selectively parallel resistors 204; and a third resistor select line 210 is connected only to the gate of the access NFET in the single resistor 202 with the gate of the coupling NFET tied off, i.e., to ground. Program select lines 212, 214, 216, 218, 220, 222, 224, 226 are selectable to program each resistor in resistor units 180, 202, 204, substantially as described for switched resistance units 150, 180 of FIGS. 3A-B. In this example, however, the parallel resistance exhibited by the four programmed resistors at the resistive load line output 228 also depends upon which of the resistor select lines 206, 208, 210 are raised. Accordingly, a typical state of the art design library may be supplemented with resistor arrays or multi-way adjustable resistors, e.g., 150, 180 and 200. Thereafter, any combination of such multi-way adjustable resistors may be selected and combined for use as dynamically selectable programmable resistors.

Figure 4:
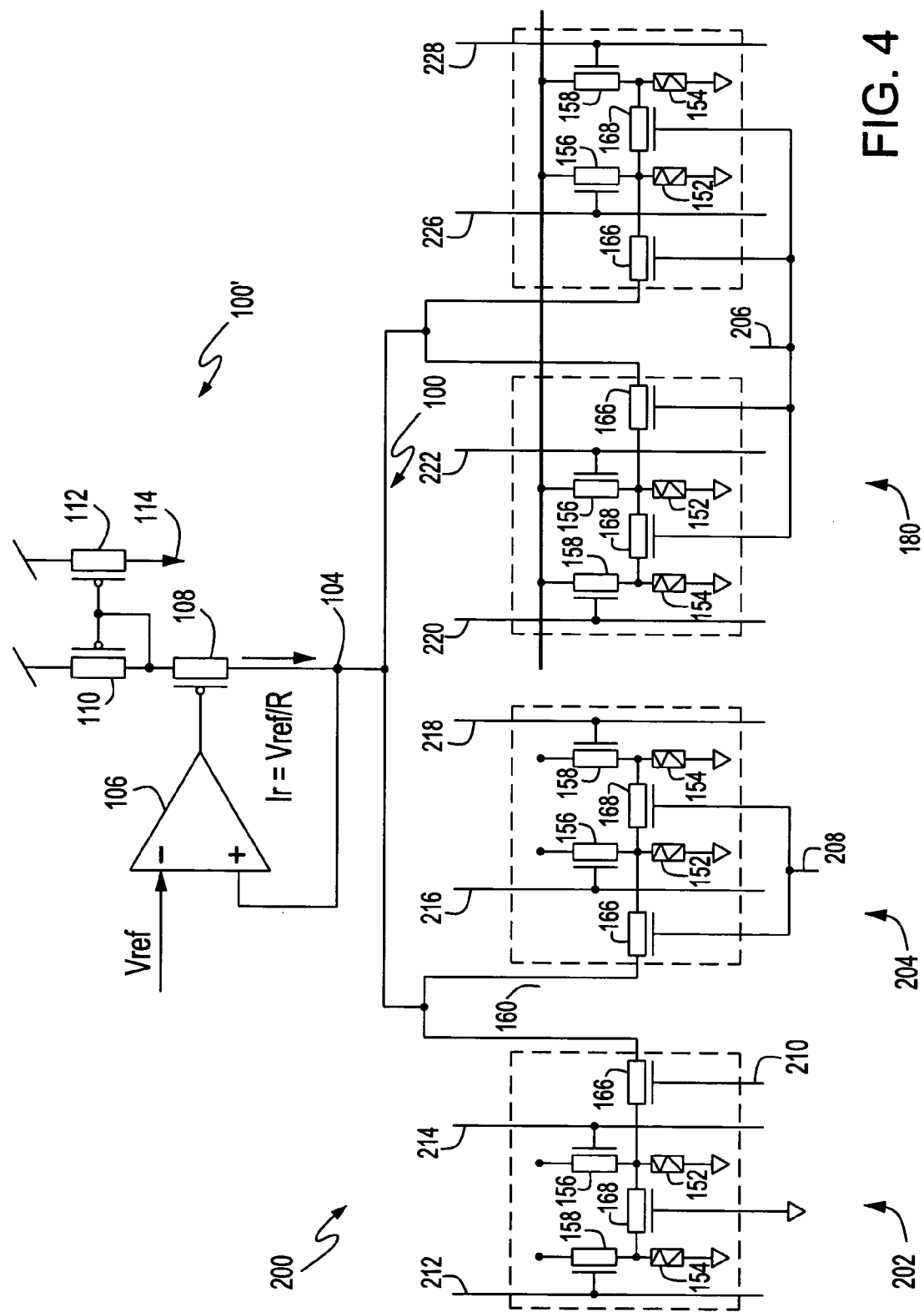
FIG. 4 shows another example of the current source using a dynamically programmed adjustable resistor for current sensing.

FIG. 4 shows another example of a current source 100' using a dynamically selectable programmable resistor 200 for current sensing and substantially identical to the current source 100 of FIG. 1; wherein the adjustable resistor is a dynamically selectable programmable resistor 200 as in the example of FIG. 3C. Accordingly, operation of the current source 100' of this example is substantially identical to the current source 100 of FIG. 1 and current depends both upon EA resistor states and which of the resistor select lines 206, 208, 210 are raised. Although presented here as a parallel resistive array 200, this is for example only. It is understood that any parallel-serial combination of resistors or a serial resistive array may be formed as needed for the particular application.

Advantageously, preferred embodiment resistive networks are small, easy to program and reprogram EA resistors that are much less susceptible to process variations than traditional IC resistors. By combining programmable resistances and providing appropriate decoding, a wide tuning range is achieved with much finer resolution than was previously available. Preferred small EA resistors have a low resistance value that ranges from 1-4 KΩ depending on film thickness and Sn doping concentration and, a high resistance value that is 3 to 6 orders of magnitude higher. Further, preferred small EA resistors are much easier to program than conventional IC resistive network resistors and, unlike these contemporary IC resistors, the resistance of each EA resistor is just as easily reprogrammable. Additionally, the programmed value is non-volatile in that once the resistor is set or reset, it maintains that programmed value even after power is removed and until it is reprogrammed. In yet another advantage, preferred EA resistors are nearly immune to process variations and precautions may be taken to avoid any susceptibility to process variations, e.g., surrounding array edge cells with lithographic dummy cells may avoid unwanted edge effect biases. Moreover, unlike state of the art polysilicon or diffusion resistors, preferred embodiment EA resistors are formed at the back-end-of-the-line (BEOL) and so, subjected to less subsequent characteristic-altering processing and easily integrated into existing semiconductor fabrication processes.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A CMOS integrated circuit (IC) including an array of programmable resistive elements, each of said programmable resistive elements comprising:

a first field effect transistor (FET), the drain of said first FET connected to a selectable program-supply line;

a program select connected to the gate of said first FET;

a second FET, the drain of said second FET coupled to a resistive load line;

a resistor select connected to the gate of said second FET; and a phase change resistor connected to the source of said first FET and the source of said second FET, wherein said phase change resistor is a chalcogenide resistor, wherein said source of said first FET and said second FET are connected together and to one end of said chalcogenide resistor and an other end of said chalcogenide resistor is connected to ground, and wherein said programmable resistive elements in said array are organized into pairs of said programmable resistive elements, the drain of said first FET in each of said pairs being connected to a common selectable program-supply line, the drain of one said second FET in each of said pairs being connected to said resistive load line and the drain of the other said second FET in each of said pairs being connected to the source of said one second FET.

2. A CMOS IC as in claim 1, wherein ones of said pairs is a dual-cell switched resistance unit, said array being an array of dual-cell switched resistance units.

3. A CMOS IC as in claim 1, wherein four of said pairs of programmable resistive elements are connected to a common said selectable program-supply line and a common said resistive load line, said four forming a dynamically variable resistor.

4. A CMOS IC as in claim 3, wherein a four bit select is connected to said resistor select and said resistance adjust on two of said four, a two bit select is connected to said resistor select and said resistance adjust on a third of said four and, said resistance adjust is grounded on a fourth of said four.

5. A programmable integrated circuit (IC) resistor comprising:

a first field effect transistor (FET) connected at a first conduction terminal to a selectable program-supply line;

a program select connected to the gate of said first FET;

a second FET connected at a first conduction terminal to a resistive load line;

a resistor select connected to the gate of said second FET;

each said transistor is a transistor and each said control terminal is a FET gate;

a third FET connected at a drain terminal to said selectable program-supply line;

a second program select connected to the gate of said third FET;

a fourth FET connected at one conduction terminal to said one end; and a resistance adjust select connected to the gate of said fourth FET a phase change resistive element connected to a second conduction terminal of said first FET and a second conduction terminal of said second FET, wherein said second conduction terminal of said first FET and said second conduction terminal of said second FET are connected to one end of said phase change resistive element and another end of said phase change resistive element is connected to ground; and a second phase change resistive element connected to a source of said third FET and an other conduction terminal of said fourth FET.

6. A programmable IC resistor as in claim 5, wherein said phase change resistive element is a chalcogenide element.

7. A dynamically variable resistor comprising a plurality of programmable IC resistors as in claim 6 connected to a common said selectable program-supply line and a common said resistive load line.

8. A dynamically variable resistor as in claim 7, wherein said plurality of programmable IC resistors comprises:

four said programmable IC resistors, said resistor select and said resistance adjust being connected to a four bit select on two of said four, said resistor select and said resistance adjust being connected to a two bit select on a remaining one of said four and said resistance adjust being grounded on a fourth of said four;

whereby resistance of said dynamically variable resistor is tuned both by switching phases on individual chalcogenide elements and individually switching said four bit select, said two bit select and said resistance adjust on said remaining one.

9. A CMOS current source including a dynamically variable resistor as in claim 8, said current source further comprising:

an operational amplifier (op-amp), a reference voltage connected to a first op-amp input and said dynamically variable resistor connected to a second op-amp input;

a first PFET gated by an output of said op-amp, a drain of said PFET connected to said common resistive load line;

a second PFET connected gate to drain to the source of said first PFET; and a third PFET having its gate connected to the gate of said second PFET, the drain of said third PFET being the output of said current source.

10. An IC including an array of programmable resistors, wherein said programmable IC resistor in claim 6 is a dual-cell switched resistance unit, said array being an array of dual-cell switched resistance units.

11. A CMOS integrated circuit (IC) including:

an array of programmable resistive elements organized into pairs of said programmable resistive elements, each of said programmable resistive elements comprising:

a first field effect transistor (FET), the drain of said first FET connected to a selectable program-supply line, a program select connected to the gate of said first FET, a second FET, the drain of said second FET coupled to a resistive load line, a resistor select connected to the gate of said second FET, and a chalcogenide resistor connected at one end to the source of said first FET and the source of said second FET and another end of said chalcogenide resistor being connected to ground;

the drain of said first FET in each of said pairs being connected to a common selectable program-supply line, the drain of one said second FET in each of said pairs being connected to said resistive load line and the drain of the other said second FET in each of said pairs being connected to the source of said one second FET;

four of said pairs of programmable resistive elements being connected to a common said selectable program-supply line and a common said resistive load line, said four forming a dynamically variable resistor;

a four bit select connected to said resistor select and said resistance adjust on two of said four;

a two bit select connected to said resistor select and said resistance adjust on a third of said four, said resistance adjust being grounded on a fourth of said four;

an operational amplifier (op-amp), a reference voltage connected to a first op-amp input and said dynamically variable resistor connected to a second op-amp input;

a first PFET gated by an output of said op-amp, a drain of said PFET connected to said common resistive load line;

a second PFET connected gate to drain to the source of said first PFET; and a third PFET having its gate connected to the gate of said second PFET, the drain of said third PFET being the output of said current source;

whereby resistance of said dynamically variable resistor is tuned both by switching phases on individual chalcogenide resistors and individually switching said four bit select, said two bit select and said resistance adjust on fourth of said four.

* * * * *